(12) United States Patent
Ducourt et al.

(10) Patent No.: US 6,362,960 B1
(45) Date of Patent: Mar. 26, 2002

(54) CASE FOR CONTAINING FAN-COOLED ELECTRONIC EQUIPMENT

(75) Inventors: Emmanuel Ducourt, Les Mureaux; Jean-Paul Prevot, Fontenay le Fleury, both of (FR)

(73) Assignee: Bull, S.A., Louveciennes (FR)

( * ) Notice: Subject to any disclaimer, the term of this patent is extended or adjusted under 35 U.S.C. 154(b) by 0 days.

(21) Appl. No.: 09/553,607

(22) Filed: Apr. 20, 2000

(30) Foreign Application Priority Data

Apr. 20, 1999 (FR) .............................. 99 04976

(51) Int. Cl.[7] .................................................. H05K 7/20
(52) U.S. Cl. ........................................ 361/695; 454/184
(58) Field of Search .................. 62/259.2; 361/687–688, 361/694–695; 454/184

(56) References Cited

U.S. PATENT DOCUMENTS 5,793,610 A 8/1998 Lyle et al.
6,052,281 A * 4/2000 Hardt et al. ................. 361/690

FOREIGN PATENT DOCUMENTS

JP 3244197 * 10/1991 ................. 361/695

OTHER PUBLICATIONS

"Modular Disk Assembly" IBM Technical Disclosure Bulletin, US IBM Corp, NY, vol. 38, No. 8, p. 35–36 XP000534419 ISSN 0018–8689 Entire Document.

"Fault Tolerant Cooling of Multiple Parallel Processor Modules" IBM, Technical Disclosure Bulletin, US IBM, NY, vol. 39, No. 5, p. 171–172 XP000584095 ISSN:0018–8689 Entire Document.

* cited by examiner

*Primary Examiner*—Gregory Thompson
(74) *Attorney, Agent, or Firm*—Miles & Stockbridge P.C.; Edward J. Kondracki

(57) ABSTRACT

A case (1) for housing at least one unit of electronic equipment (2) includes at least one fan (3) and an opening (15) for extracting the fan (3). A moving element (18, 28, 4, 33) is provided which, when the fan (3) is inside the case (1), is maintained in contact with at least one side of the fan (3). When the fan (3) is not inside the case (1), the moving element is maintained in contact with the case (1) so as to obstruct the opening (15) of the case (1) through which the fan is extracted.

6 Claims, 5 Drawing Sheets

CASE FOR CONTAINING FAN-COOLED ELECTRONIC EQUIPMENT

BACKGROUND OF THE INVENTION

1. Field of the Invention

The field of the invention is the fan-cooling of electronic equipment. The invention relates more specifically to a case for containing electronic equipment that needs to be cooled.

2. Description of Related Art

In the prior art, such a case contains two openings, with a fan close to a first opening aspirating the air contained in the case so as to propel it to the outside through the first opening. The resulting low pressure inside the case creates a draft through the second opening which, by flowing over the electronic equipment, cools it.

To avoid having to shut down the equipment when the fan fails, the case is equipped with several fans. Thus, when one fan fails, the cooling continues to be provided by one or more other fans operating as a backup.

To replace the failed fan, it is extracted from the case through an opening provided especially for this purpose. Another fan is then inserted into the case through this same opening.

In the absence of a fan inside the case, the insertion-extraction opening creates a draft in the case toward the other fan which, by reducing the low pressure inside the case, is detrimental to the proper cooling of the electronic equipment, and possibly to the operational state of the backup fan.

It is of course possible to place a cover over the insertion-extraction opening while waiting to install another fan. However, the problem of the draft between the moment in which the fan is extracted and the moment in which the cover is put in place, and between the moment in which the cover is removed and the moment in which the other fan is inserted, still exists.

SUMMARY OF THE INVENTION

In order to eliminate the drawbacks of the prior art mentioned above, the subject of the invention is a case comprising at least one unit of electronic equipment and an opening for extracting a first fan. The case comprises a moving element which:

- when the fan is inside the case, is maintained in contact with at least one side of the fan and,
- when the fan is not inside the case, is maintained in contact with the case so as to obstruct the opening of the case.

Thus, as soon as the fan has left the case, the plate immediately obstructs the insertion opening without any additional external manipulation. No discontinuity in the cooling of the electronic equipment is observed.

It is possible to use, as the moving element, a plate maintained in position so as to obstruct the opening, for example by means of a spring. By shifting said plate, it is possible to clear the opening so as to allow the fan to be extracted, said plate being held against the fan during the extraction by an increase in the stress on the spring. In this way, the plate directly closes the opening as soon as the fan has completely left the case.

However, the device mentioned in the preceding paragraph requires a manipulation prior to the extraction of the fan, i.e., that of shifting the plate. An additional advantage is provided by the invention when said moving element is maintained by the presence of the fan inside the case in a position that leaves the opening clear for extracting the fan, which eliminates the prior operation.

BRIEF DESCRIPTION OF THE DRAWINGS

A particular embodiment of the invention is explained in the following description in reference to the figures, in which.

DESCRIPTION OF THE PREFERRED EMBODIMENTS

Figure 1A:
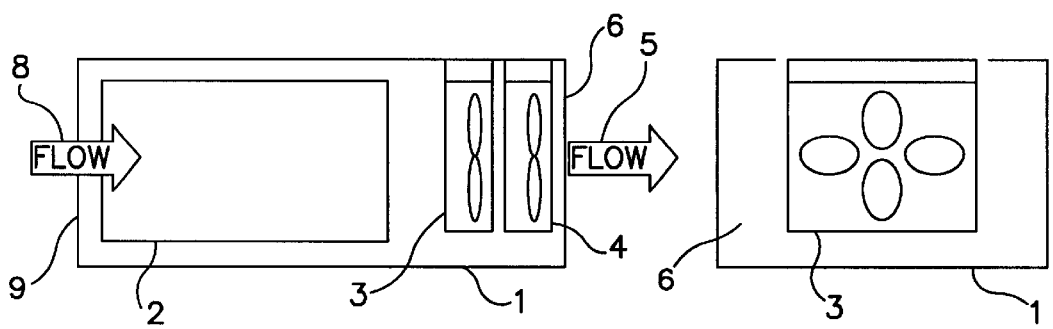
FIGS. 1a, 1b, 1c show a case lacking the characteristics of the invention.

Referring to FIG. 1a, a case 1 comprises electronic equipment 2 and two fans 3, 4. The fans 3, 4 are provided for propelling an air flow 5 through a first opening on one side 6 of the case. The air flow 5 is aspirated from the inside of the case 1 to the outside. The low pressure thus produced in the case 1 causes an air flow 8 to enter through a second opening on a side 9 opposite the side 6. The case 1 is airtight enough for the flow 8 to be equal to the flow 5.

This device ensures air circulation in the case 1 from the side 9 to the side 6, along the electronic equipment 2. This air circulation makes it possible to cool the electronic equipment 2. The side 9 is not necessarily the side opposite the side 6. In the event that the side 9 is a lateral side of the case 1, the second opening is disposed so as to ensure enough air circulation along the electronic equipment 2, in accordance with the prior art. The teaching described herein for fans that aspirate the air from the case 1 also holds true for fans that aspirate external air in order to compress it inside the case. In this case, the high pressure thus created inside the case 1 propels the air toward the outside through the second opening on the side 9. The high pressure solution increases the turbulence of the air flow inside the case 1. Increased turbulence promotes heat exchange, but compression increases the temperature of the circulating air. One skilled in the art would choose the most appropriate solution by calculating the optimal exchange coefficients.

Figure 1B:
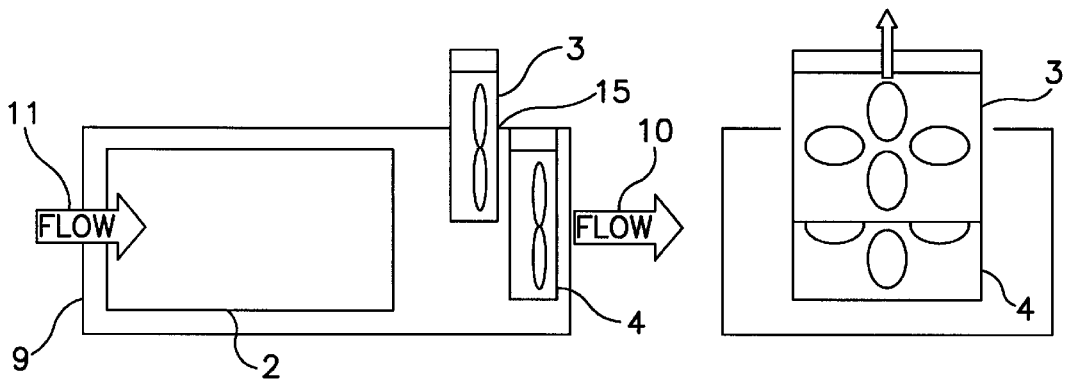

When a fan fails, for example the fan 3, the flow 5, 8 is weakened. As illustrated in FIG. 1b, the fan 3 is removed through an opening 15, so that it can be replaced. The fan 4 operates as a backup in order to extract an air flow 10 from the case 3, preferably equivalent to the flow 5. During the extraction of the fan 3, the opening 15 remains practically obstructed by the fan, and the flow 10 is approximately equal to a flow 11 entering through the side 9. As long as the fan 3 is not completely removed, the fan 4 continues to cool the electronic equipment 2.

Figure 1C:
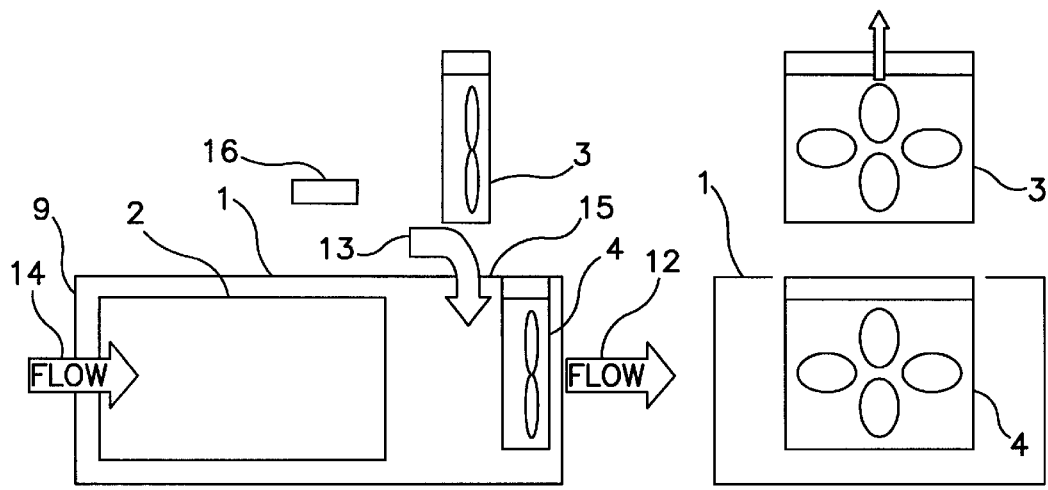

When the fan 3 is completely removed as illustrated in FIG. 1c, the opening 15 allows an air flow 13 to enter the case at low pressure. The flow 13 has the effect of considerably reducing the flow entering through the side 9, leaving only a weak flow 14 whose circulation along the electronic equipment 2 no longer provides optimal cooling. The flow 12 aspirated by the fan 4 is equal to the sum of the flows 13 and 14. After the extraction of the fan 3, it is possible to obstruct the opening 15 with a plate 16 or with a new fan 3.

However, the time interval that separates the end of the extraction of the fan 3 from the placement of the plate 16 or the new fan, is detrimental to the proper cooling of the electronic equipment 2.

Figure 2A:
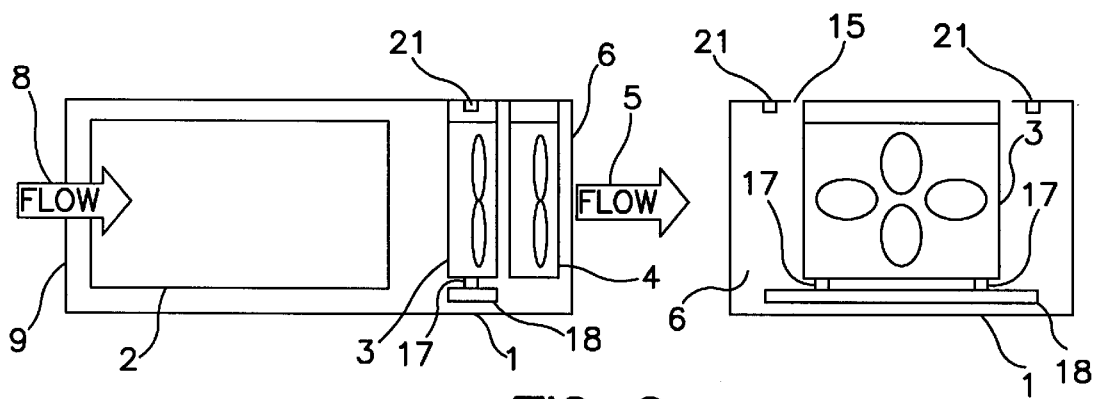
FIGS. 2a, 2b, 2c show a first exemplary case according to the invention.
Figure 2B:
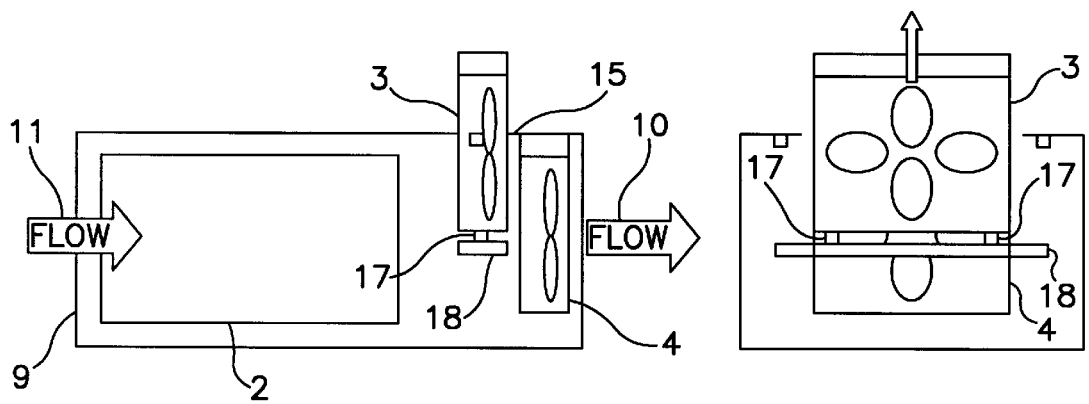
Figure 2C:
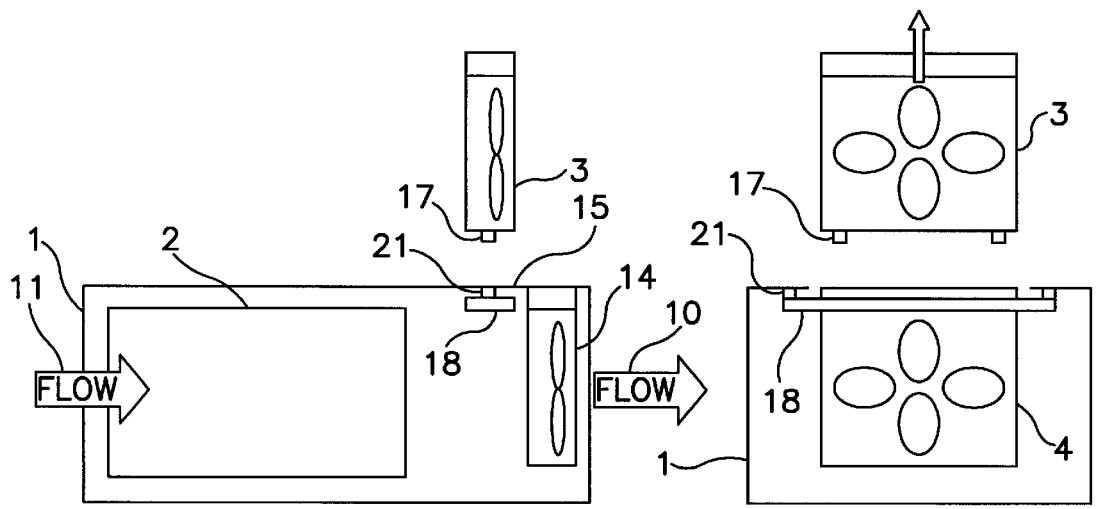

Referring to FIGS. 2a through 2c, magnets 17 are attached to the side of the fan 3 opposite the opening 15. Magnets 21 are attached to an interior side of the case 1 on the periphery of the opening 15.

Referring to FIG. 2a, the magnets 17 magnetically hold a plate 18, whose area is larger than the area of the opening 15. The cooling of the device of FIG. 2a is identical to that provided by the device of FIG. 1a.

Referring to FIG. 2b, the extraction of the fan 3 through the opening 15 carries along the plate 18 held in contact with the side of the fan 3 to which the magnets 17 are attached. This side being the one furthest from the opening 15 for the part of the fan 3 still inside the case 1, the plate is moved toward the opening 15 during the extraction of the fan 3. As long as the side to which the magnets 17 are attached is inside the case 1, the fan 3 obstructs the opening 15. The cooling of the electronic equipment 2 is identical to that which results from FIG. 1b.

Referring to FIG. 2c, when the side of the fan 3 to which the magnets 17 are attached leaves the case 1, the plate 18, whose area is larger than that of the opening 15, is held in place by the case 1 at the level of this opening. The plate 18 is then maintained in contact with the case 1 by the magnets 21 attached to it. Thus, the plate 18 obstructs the opening 15 as soon as the fan 3 has left the case 1. The outgoing air flow 10 is equal to the incoming air flow 11 in the absence of the fan 3 inside the case 1, at all times.

The insertion of a fan 3 into the case 1 is performed by a reverse process that moves backward through FIGS. 2c to 2a. The plate 18 is therefore initially maintained in contact with the case by the magnets 21, as shown in FIG. 2c. The insertion of the fan 3 pushes the plate 18, which separates from the magnets 21, as shown in FIG. 2b. The plate 18 is maintained in contact with the fan 3 by means of the magnets 17. The insertion of the fan 3 obstructs the opening 15 so that the value of the flows 10 and 11 remains substantially constant. The fan 3 being fully inserted into the case 1 as shown in FIG. 2a, the plate 18 is maintained in contact with the fan 3.

Because of the device represented in FIGS. 2a through 2c, the proper cooling of the electronic equipment 2 is not subject to any interruption during the extraction or insertion of the fan 3 through the opening 15 in the case 1.

Figure 3A:
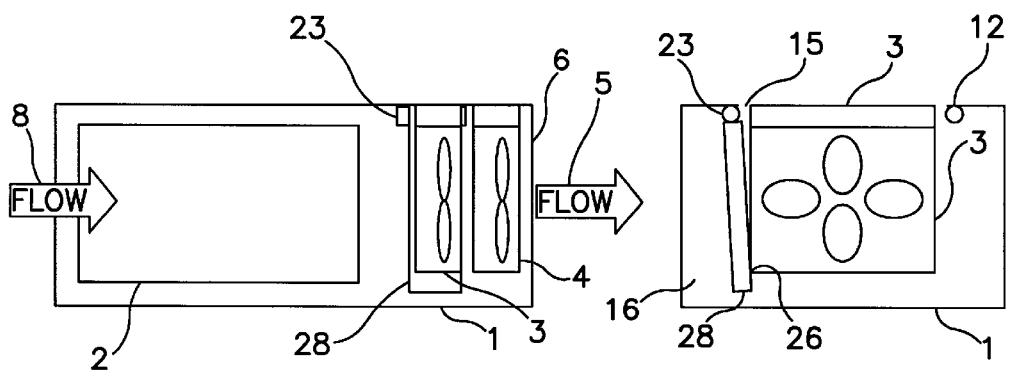
FIGS. 3a, 3b, 3c show a second exemplary case according to the invention.
Figure 3B:
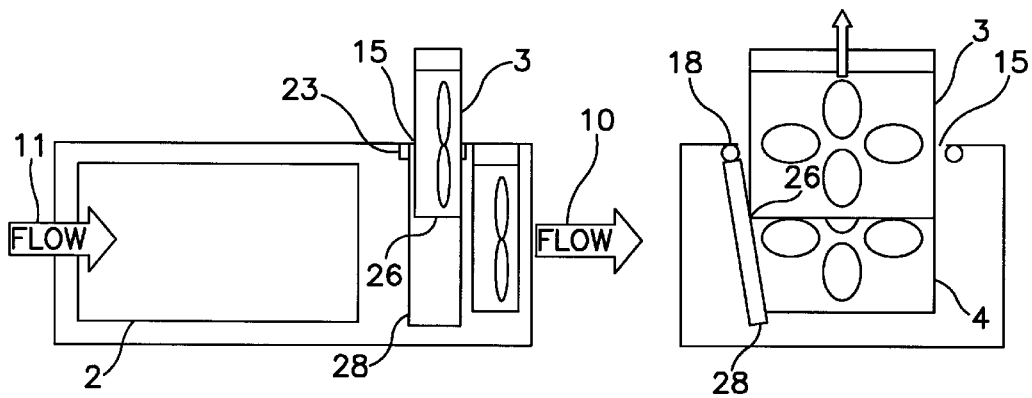
Figure 3C:
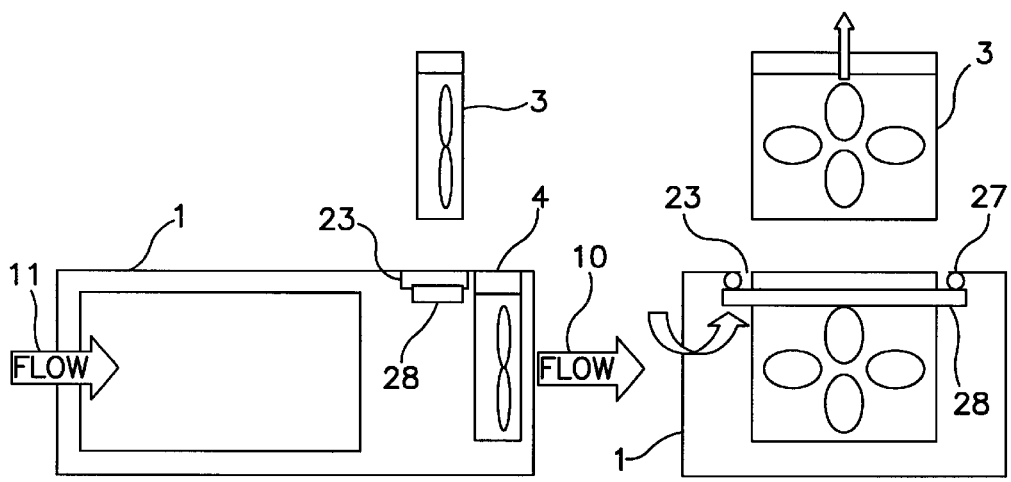

Referring to FIGS. 3a through 3c, a first end of a spring 23 is attached to an interior surface of the case 1 on one edge of the opening 15. A first edge of a plate 28 is attached to a second end of the spring 23. The spring 23 is compressed in rotation.

Referring to FIG. 3a, the fan 3 presses on the plate 28 so as to maximally compress the spring 23. The compression of the spring 23 maintains the plate 28 in contact with an edge 26 common to the bottom side of the fan 3 and to the vertical side of the fan 3 closest to the spring 23. The bottom side of the fan 3 in this case is the side furthest from the opening 15. The cooling by the device of FIG. 3a is identical to that provided by the device of FIG. 1a.

Referring to FIG. 3b, during the extraction of the fan 3 through the opening 15, the plate 28 is maintained in contact with the edge 26 of the bottom side of the fan 3 by the compression of the spring 23. This side being the one furthest from the opening 15 for the part of the fan 3 still inside the case 1, the extraction of the fan 3 decompresses the spring 23, which has the effect of rotating the plate 28 so as to move it toward the opening 15. As long as the bottom side is inside the case 1, the fan 3 obstructs the opening 15. The cooling of the electronic equipment 2 is identical to that which results from FIG. 1b.

Referring to FIG. 3c, when the bottom side of the fan 3 leaves the case 1, the plate 28, whose area is larger than that of the opening 15, is held in place by the case 1 at the level of this opening on a stop 27. The plate 28 is therefore maintained in contact with the case 1 by the spring 23, which is attached to it so as to still be sufficiently compressed. Thus, the plate 28 obstructs the opening 15 as soon as the fan 3 has left the case 1. The outgoing air flow 10 is equal to the incoming air flow 11 in the absence of the fan 3 inside the case 1, at all times.

The insertion of a fan 3 into the case 1 is performed by a reverse process that moves backward through FIGS. 3c to 3a. The plate 28 is therefore initially maintained in contact with the case by a slight compression of the spring 23, as illustrated in FIG. 3c. The insertion of the fan 3 pushes the plate 28, which is subjected to a rotating movement, as illustrated in FIG. 3b. The plate 28 is maintained in contact with the fan 3 by means of the spring 23, which is more strongly compressed. The insertion of the fan 3 obstructs the opening 15 so that the value of the flows 10 and 11 remains substantially constant. The fan 3 being fully inserted into the case 1 as illustrated in FIG. 3a, the plate 28 is maintained in contact with the fan 3.

Because of the device represented in FIGS. 3a through 3c, the proper cooling of the electronic equipment 2 is not subject to any interruption during the extraction or insertion of the fan 3 through the opening 15 in the case 1.

According to a variant of the device of FIG. 3c, it is possible to replace the stop 27 with a magnet of the same type as the magnet 21, which ensures a complete obstruction of the opening 15 by the plate 28 in the absence of the fan 3.

Figure 4A:
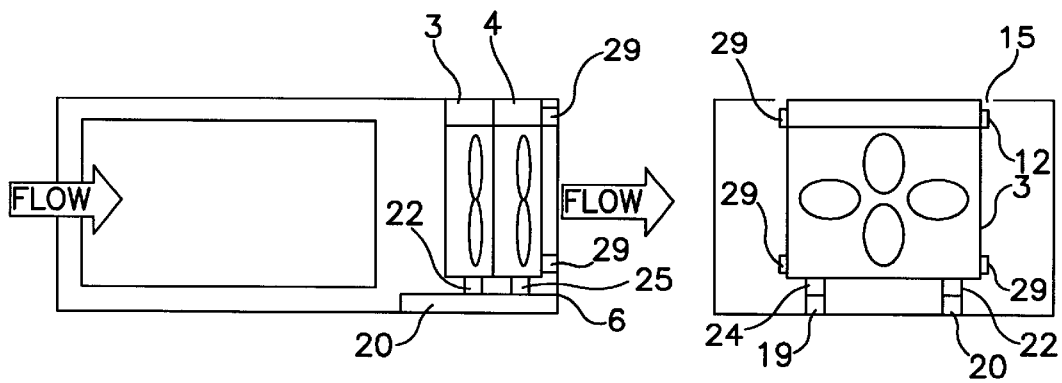
FIGS. 4a, 4b, 4c show a third exemplary case according to the invention.
Figure 4B:
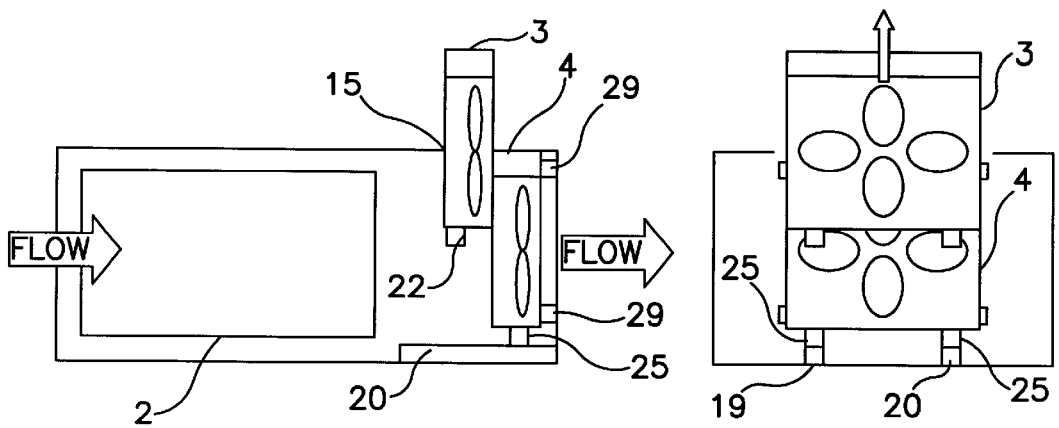
Figure 4C:
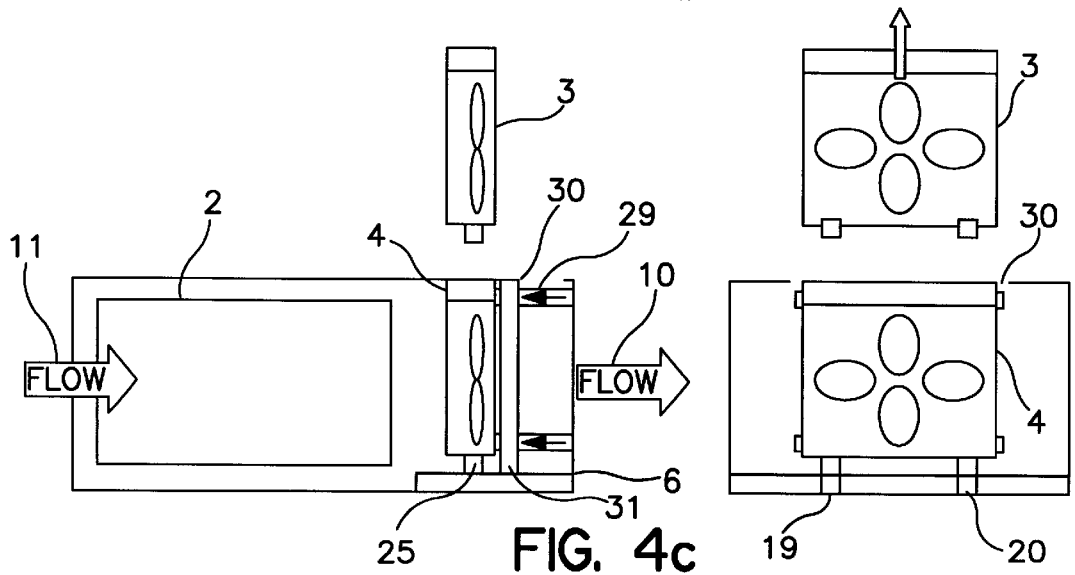

In the example of FIGS. 1a through 3c, the fans 3, 4 are connected in series. The teaching described also holds true for fans connected in parallel, and for more than two fans. FIGS. 4a through 4c present one particular example in the case where the fans 3, 4 are connected in series.

Referring to FIG. 4a, the fan 4 closest to the external side 6 is maintained in contact with the fan 3 by means of springs 29 attached to the interior wall of the side 6. The springs 29 are compressed against a side of the fan 4 adjacent to the side 6. Two rails 19, 20 connected to a power supply not represented, carry a supply voltage for the fans 3, 4. The fan 3 comprises a connector 22 plugged into the rail 20 and a connector 24 plugged into the rail 19. Likewise, the fan 4 comprises two connectors 25, each plugged into one rail 19, 20.

Referring to FIG. 4b, during the extraction of the fan 3 through the opening 15, the fan 4 is maintained in contact with the fan 3 by the compression of the spring 29. The connectors 22, 24 leave the rails 19, 20. As long as the bottom side of the fan 3 is inside the case 1 the fan 3 obstructs the opening 15, and the fan 4 is maintained in position. The cooling of the electronic equipment 2 is identical to that which results from FIG. 1b.

Referring to FIG. 4c, when the bottom side of the fan 3 leaves the case 1, the fan 3 no longer holds the fan 4, pushed by the spring 29, in place The decompression of the springs 29 moves the fan 4 away from the side 6. The connectors 25 of the fan 4 slide on the rails 19, 20 so as to allow the continuity of its power supply. By taking the place of the fan 3, the fan 4 obstructs the opening 15 as soon as the fan 3 has left the case 1. The outgoing air flow 10 is equal to the incoming air flow 11 in the absence of the fan 3 inside the case 1, at all times. An opening 30 through which the fan 4 was inserted, remains wide open. The opening 30 is not detrimental to the proper cooling of the electronic equipment 2 because the flow 10 aspirated or extracted by the fan 4 is equal to the flow 11.

The insertion of a fan 3 into the case 1 is performed by a reverse process, that moves backward through FIGS. 4c to 4a. The fan 4 is therefore initially maintained in contact with the inside of the case by a slight compression of the springs 29, as illustrated in FIG. 4c. Advantageously, the springs 29 do not press directly on the fan 4, but on a plate 31 in contact with the external side of the fan 4. The plate 31 is provided in order to prevent any bypass along the sides of the fan 4. The plate 31 projects slightly from the case 1 through the opening 30. This makes it possible to slide the plate 31 to the right, compressing the springs 29. It may now be said that a new fan 3 plays the role of a new fan 4, the old fan 4 having replaced the old fan 3. The insertion of the fan 3 replaces the fan 4, as illustrated in FIG. 4b. The plate 31 is maintained in contact with the fan 3 by means of the compressed springs 29. The insertion of the fan 3 obstructs the opening 30 so that the value of the flows 10 and 11 remains substantially constant. The new fan 3 being fully inserted into the case 1 as illustrated in FIG. 4a, the plate 31 is maintained in contact with the fan 3.

Because of the device represented in FIGS. 4a through 4c, the proper cooling of the electronic equipment 2 is not subject to any interruption during the extraction or insertion of the fan 3 through the opening 15, or respectively through the opening 30, in the case 1.

The insertion of the new fan 3 into the case plugs its connectors 22, 24, respectively, into the rails 19, 20 so as to allow it to be supplied with power. This rail connection device is particularly useful for the device of FIG. 4 because it allows a continuous power supply of the fan 4 during its lateral translational movement inside the case 1. This connection device is usable in the other figures. It has not been represented because more conventional connection devices are also suitable.

Figure 5A:
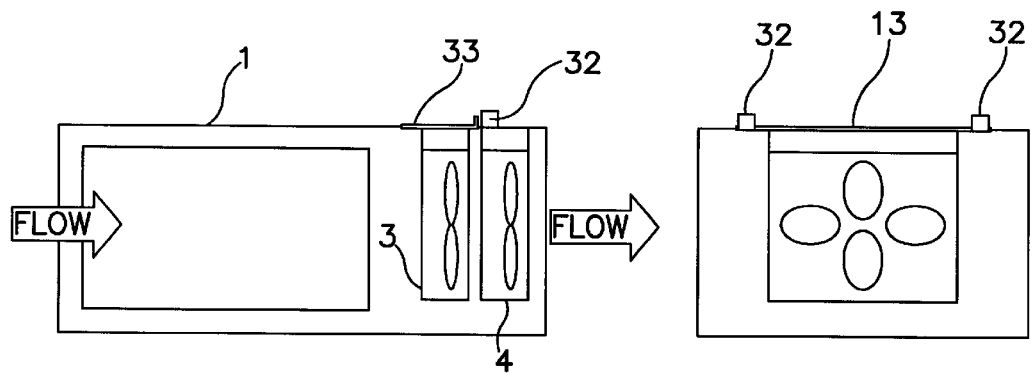
FIGS. 5a, 5b, 5c show a fourth exemplary case according to the invention.
Figure 5B:
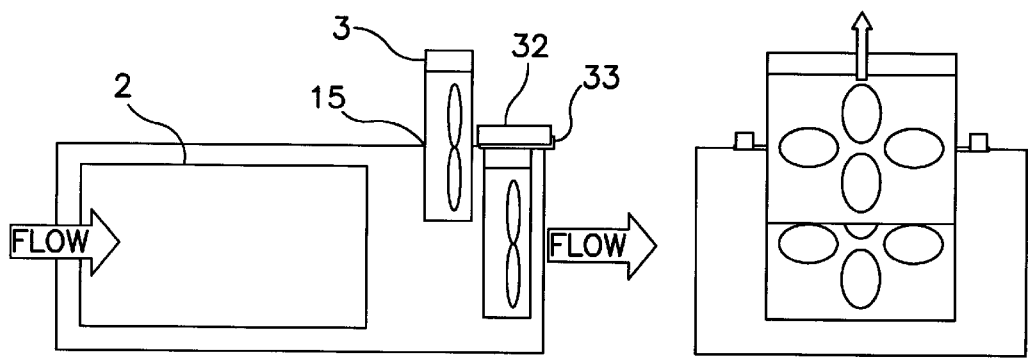
Figure 5C:
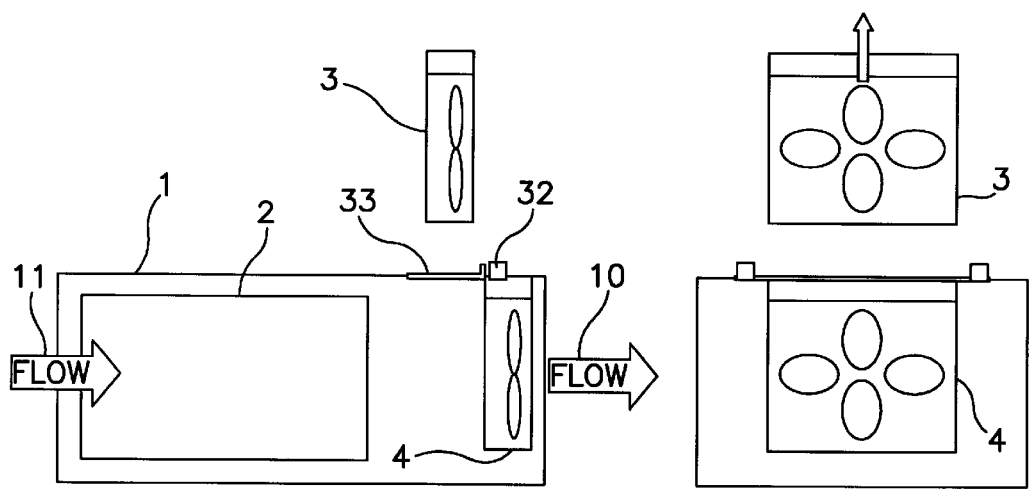

Referring to FIGS. 5a through 5c, a first end of springs 32 is attached to an external surface of the case 1 on one edge of the opening 15. A first edge of a plate 33 is attached to a second end of the spring 32. The springs 32 are stretched tight.

Referring to FIG. 5a, the tension of the spring 32 holds the plate 33 over the fan 3 so as to close the opening 15. The cooling by the device of FIG. 5a is identical to that provided by the device of FIG. 1a.

Referring to FIG. 5b, the plate 33 is shifted laterally on the case 1 so as to clear the opening 15 for the extraction of the fan 3. The movement of the plate 33 causes an overextension of the springs 32, which tends to return the plate 33 to its initial position over the opening 15. During the extraction of the fan 3 through the opening 15, the plate 33 is maintained in contact with a vertical side of the fan 3 by the overextension of the springs 32. This overextension causes an increase in the stress of the springs 32, which holds the plate 33 against the fan 3. As long as the vertical side of the fan 3 is inside the case 1, the fan 3 obstructs the opening 15. The cooling of the electronic equipment 2 is identical to that which results from FIG. 1b.

Referring to FIG. 5c, when the vertical side of the fan 3 leaves the case 1, the plate 33 is pushed back over the fan 15 by the spring 32. Thus, the plate 33 obstructs the opening 15 as soon as the fan 3 has left the case 1. The outgoing air flow 10 is equal to the incoming air flow 11 in the absence of the fan 3 inside the case, at all times.

An insertion of the fan 3 into the case 1 is performed by a reverse process that moves backward through FIGS. 5c to 5a. The plate 33 is therefore initially held over the opening 15 by a slight extension of the spring 32, as represented in FIG. 5c. The plate 33 is shifted laterally so as to clear the opening 15. The insertion of the fan 3 maintains the plate 33 in the shifted position, as illustrated in FIG. 5b. The plate 33 is maintained in contact with the vertical side of the fan 3 by means of the spring 32, which remains more tightly stretched. The insertion of the fan 3 obstructs the opening 15 so that the value of the flows 10 and 11 remains substantially constant. The fan 3 being fully inserted into the case 1 as illustrated in FIG. 5a, the plate 33 is pushed back over the opening 15 by the spring 32.

Because of the device represented in FIGS. 5a through 5c, the proper cooling of the electronic equipment 2 is not subject to any interruption during the extraction or insertion of the fan 3 through the opening 15 in the case 1. While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein and defined in the claims.

What is claimed is:

1. A case comprising:
   at least one electronic equipment unit;
   a fan being adapted to be disposed in a first position inside the case and capable of being removed from the case;
   an opening for extracting the fan from the case; and
   a moving element being maintained in contact with at least one side of the fan when the fan is inside the case, the moving element being maintained in contact with the case to obstruct the opening of the case when the fan is extracted from the case and maintained in a position that leaves the opening clear for extracting the fan when the fan is inside the case,
   wherein the moving element is a plate maintained in contact with the fan by at least one magnet attached to the fan.

2. A case according to claim 1, further comprising a supply rail disposed within the case, and wherein the fan includes a connector for plugging into the supply rail.

3. A case comprising:
   at least one electronic equipment unit;
   a fan being adapted to be disposed in a first position inside the case and capable of being removed from the case;
   an opening for extracting the fan from the case; and
   a moving element being maintained in contact with at least one side of the fan when the fan is inside the case, the moving element being maintained in contact with the case to obstruct the opening of the case when the fan is extracted from the case and maintained in a position that leaves the opening clear for extracting the fan when the fan is inside the case,
   wherein the moving element is a plate maintained in contact with the case by at least one magnet attached to the case.

4. A case according to claim 3, further comprising a supply rail disposed within the case, and wherein the fan includes a connector for plugging into the supply rails.

5. A case comprising:

at least one electronic equipment unit;

a first fan being adapted to be disposed in a first position inside the case and capable of being removed from the case;

an opening for extracting the first fan from the case; and a moving element being maintained in contact with at least one side of the first fan when the first fan is inside the case, the moving element being maintained in contact with the case so as to obstruct the opening of the case when the first fan is extracted from the case and maintained in a position that leaves the opening clear for extracting the first fan when the first fan is inside the case, wherein the moving element is a second fan maintained in contact with the first fan by a compression spring attached to the case, the second fan being movable within the case to the position of the first fan when the first fan is extracted.

6. A case according to claim 5, further comprising supply rails disposed within the case, and wherein the first and second fans include connectors for plugging into the supply rails.

* * * * *